United States Patent
Butka et al.

(10) Patent No.: US 7,065,456 B1
(45) Date of Patent: Jun. 20, 2006

(54) TOOL MONITORING SYSTEM AND METHOD

(75) Inventors: Stephen J. Butka, Columbus, OH (US); James P. Naderer, West Liberty, OH (US); Ryan A. VanderWeele, Marysville, OH (US)

(73) Assignee: Honda Motor Co., Ltd., Tokyo (JP)

( * ) Notice: Subject to any disclaimer, the term of this patent is extended or adjusted under 35 U.S.C. 154(b) by 56 days.

(21) Appl. No.: 10/921,546

(22) Filed: Aug. 19, 2004

(51) Int. Cl.
*G01R 15/00* (2006.01)

(52) U.S. Cl. .......................... 702/57; 702/47; 702/98; 702/138

(58) Field of Classification Search .................. 702/57, 702/44, 41, 33, 47, 43, 98, 104, 138; 417/53, 417/295, 14, 22, 34, 32; 700/282; 60/410; 368/409
See application file for complete search history.

(56) References Cited

U.S. PATENT DOCUMENTS

| | | | |
|---|---|---|---|
| 3,664,183 A | 5/1972 | Treible, Jr. | |
| 4,051,351 A | 9/1977 | Mallick, Jr. et al. | |
| 4,245,316 A | 1/1981 | Koikawa et al. | |
| 4,365,306 A | 12/1982 | House et al. | |
| 4,676,095 A | 6/1987 | Eberle et al. | |
| 5,689,434 A * | 11/1997 | Tambini et al. ............. 700/282 |
| 5,898,598 A | 4/1999 | Szwast et al. | |
| 5,918,201 A | 6/1999 | Szwast et al. | |
| 5,967,757 A * | 10/1999 | Gunn et al. .................... 417/34 |
| 6,082,971 A * | 7/2000 | Gunn et al. .................... 417/32 |
| 6,252,823 B1 * | 6/2001 | McDonald et al. ............ 368/9 |
| 6,519,938 B1 * | 2/2003 | Foss ............................ 60/410 |
| 6,567,754 B1 | 5/2003 | Lysaght | |
| 2003/0105599 A1 | 6/2003 | Fisher et al. | |
| 2003/0212534 A1 | 11/2003 | Lysaght | |

* cited by examiner

*Primary Examiner*—John Barlow
*Assistant Examiner*—Hien Vo
(74) *Attorney, Agent, or Firm*—Rankin, Hill, Porter & Clark LLP; Vincent Ciamacco

(57) ABSTRACT

A transducer is provided in communication with a power supply of a powered tool for detecting power consumption associated with powered and non-powered operational states and generating a power consumption signal. A measuring implementation is provided for receiving the power consumption signal and measuring intervals associated with at least one of the powered and non-powered operational states, so as to produce an operational history of the powered tool corresponding to a predetermined time period. A production counter is used for counting production units produced by the powered tool during the predetermined time period. A correlating implementation is provided for correlating the operational history with the production units, so to as generate a productivity indicator.

15 Claims, 2 Drawing Sheets

TOOL MONITORING SYSTEM AND METHOD

BACKGROUND OF THE INVENTION

The presently disclosed embodiments are directed to the field of manufacturing performance monitoring and assurance. In a manufacturing process, productivity is directly impacted by the amount of time spent on a particular operation. In an assembly line environment the majority of operational time is clearly defined. Work that needs to be completed has little variation from product to product, such as stations for sanding and polishing defects in paint.

At such stations, operational time is undetermined, since each job is uniquely performed on a "case by case" basis. It has thus proven difficult to quantify the amount of time needed to perform such operations. It has further been observed that undefined work intervals invite low performance on the part of workers, which can also have a detrimental effect of productivity efficiency.

In order to improve efficiency, it has been contemplated to perform time studies to determine suitable lengths for these operations, e.g. for sanding and polishing scuff marks on paint. In one time study, observations were made using a stopwatch from alongside the line. In some instances, the process durations were very short, making it difficult to obtain accurate timings. In a sanding or buffing operation, the processing time can vary in accordance with a number of variables. For example, the polishing interval can vary based on: color of the applied paint; the depth of the scuff; personal polishing technique; the amount of rubbing compound applied; saturation of the pad with rubbing compound; and the state of the polishing pad, i.e. whether the pad is new, recently washed or heavily worn. It was also concluded that when manufacturing personnel are being observed, they might perform their operations differently than under normal unobserved operating conditions. Also, manual time measurement can be a subjective approach prone to human error. The above factors notwithstanding, it is generally concluded that productive work is directly related to the actual operation of the tool. However, there has not been a suitable method and apparatus for quantifying the time spent in these types of operations, or for comparing the time with the quality of the end-product.

SUMMARY OF THE INVENTION

The difficulties and drawbacks associated with previous-type systems are overcome in the present method and apparatus for monitoring, including a transducer in communication with a power supply of a powered tool for detecting power consumption associated with powered and non-powered operational states and generating a power consumption signal. A measuring implementation is provided for receiving the power consumption signal and measuring intervals associated with at least one of the powered and non-powered operational states, so as to produce an operational history of the powered tool corresponding to a predetermined time period. A production counter is used for counting production units produced by the powered tool during the predetermined time period. A correlating implementation is provided for correlating the operational history with the production units, so to as generate a productivity indicator.

As will be realized, the invention is capable of other and different embodiments and its several details are capable of modifications in various respects, all without departing from the invention. Accordingly, the drawings and description are to be regarded as illustrative and not restrictive.

DETAILED DESCRIPTION OF THE EMBODIMENTS

Figure 1:
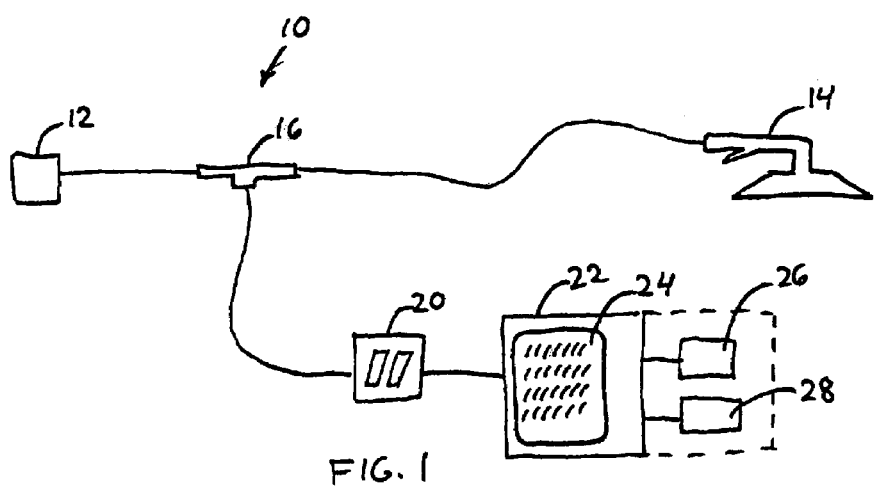
FIG. 1 shows the general configuration of a preferred embodiment of the present system.

FIG. 1 shows a monitoring system 10 for measuring operational time of a powered tool. A power supply 12 is used to supply power to a powered tool 14. In the preferred embodiment, the power supply can be a compressed air supply supplied from a central air compressor through a plant pneumatic air supply system. The powered tool 14 is preferably a pneumatic tool powered by the compressed air supply, e.g. an air-powered buffer or grinder. However, it should be appreciated that embodiments could be contemplated in which other type power sources are used, such as electrical, hydraulic or any other suitable power supply as would occur to those skilled in the art.

A transducer 20 is provided, preferably an air pressure transducer in accordance with the preferred embodiment. The transducer 20 is in communication with the power supply 12, and is used for detecting power consumption (e.g. air pressure drops) associated with the respective powered and non-powered operational states. The transducer 20 generates a power consumption signal indicative of power consumption. As indicated in FIG. 1, an air pressure transducer 20 is connected to the air supply 12 with a tap 16, in line with the air supplied to the pneumatic tool 14, so as to communicate pressure drops arising from tool operation to the pressure transducer 20.

Figure 2A:
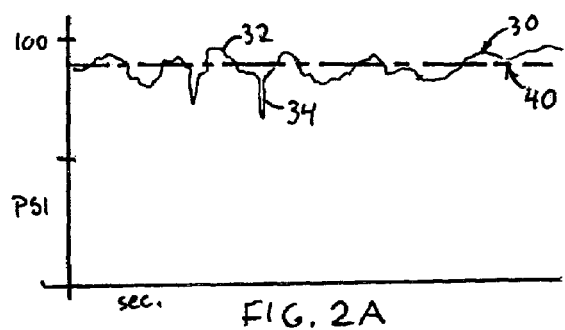
FIGS. 2A and 2B are graphs showing variations in system air pressure and the relationships to operational time in accordance with a preferred embodiment.

The power consumption signal from the transducer 20 is preferably an analog signal that is subsequently digitally processed. A measuring implementation 22 (e.g. a microprocessor-based PLC, such as sold by Mitsubishi Electric under product number AL-20MR-D) receives the power consumption signal and processes the signal to measure intervals associated with one or both of the powered and non-powered operational states. The graph of FIG. 2A shows the analog air pressure signal 30 over time. Variations 32 in the air supply create continuous low-amplitude signal fluctuations. And high-amplitude, transient dips 34 in pressure are indicative of accidental tool actuations, not related to actual tool operation. The measuring implementation 22 preferably includes a signal processing implementation for processing the analog power consumption signal, so as to filter out signal components corresponding to such variations in the power supply output, resulting in a clean, flat digital signal 40 that can be utilized in subsequent processing.

Figure 2B:
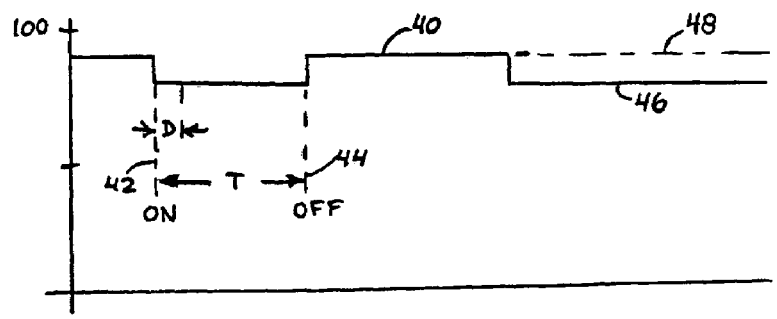

FIG. 2B is a graph depicting the operational variations in the digital air pressure signal 40 as a function of time. A pressure drop 42 is indicative of a tool actuation. The signal processing implementation measures a time delay D, preferably a short interval such as 0.3 seconds, after which a measurement of an operational period T is indicated. Intervals shorter than the time delay D are regarded as transient tool actuations and are discarded, so as to filter out these events from the digital signal. A pressure rise 44 in the signal to the original pressure level is indicative of the end of an operational period. Long intervals 46 larger than a predetermined time period (e.g. 30 sec. or 45 sec.) are also discarded as being considered too long, and indicative of the operator continuously actuating the tool between buffing/sanding operations. Upon discarding the long intervals 46, the corresponding pressure signal level 48 is treated as constant.

The measuring implementation 22 records all the operational periods T, so as to produce an operational history of the powered tool corresponding to a predetermined time period (i.e. work shift, day, week, etc.). The operational history can be displayed on an LCD display 24, associated with the measuring implementation 22. The operational history can be displayed as a graph incorporating a time history of the digital signal 40. Alternatively, the data can be electronically recorded or tabulated in any other suitable manner for presenting information (e.g. combined or organized from multiple tools on a common database). It should also be appreciated that the operational history can be printed onto hard copy or otherwise recorded on non-volatile storage media.

As a further feature of the present system, a production counter 26 can be employed for counting production units (i.e. corrected vehicle paint defects) produced by the powered tool 14 during the predetermined time period. This production counter 26 is preferably an integrated component of the measurement system 22 as illustrated. However, it should be considered that the production counter can be a discrete automated component, in communication with the measurement system 22, or it can comprise a production input user interface for manually entering production count data, i.e. by inspection personnel at a subsequent workstation.

A correlating implementation 28 is further provided, preferably as a component of the measuring implementation 22, for correlating the operational history with the production units, so to as generate a productivity indicator. For example, the operating time for a number of actuations can be correlated with the number of defects corrected or cars worked on to obtain an estimate of time or actuation per vehicle or per vehicle defect. A productivity indicator arrived at in this manner would permit better allocation or estimation of manpower requirements. The productivity indicator can also be presented on the LCD display, and may also be recorded, tabulated and/or printed as indicated above.

The production counter 26 can also include an integrated evaluation input for evaluating produced production units with respect to one or more predetermined criteria. These criteria can include finished quality, defect rate, and number of reworking operations required to finish the product. The correlating implementation 28 utilizes the value of the evaluation input as a weighting factor for the productivity indicator.

Figure 3:
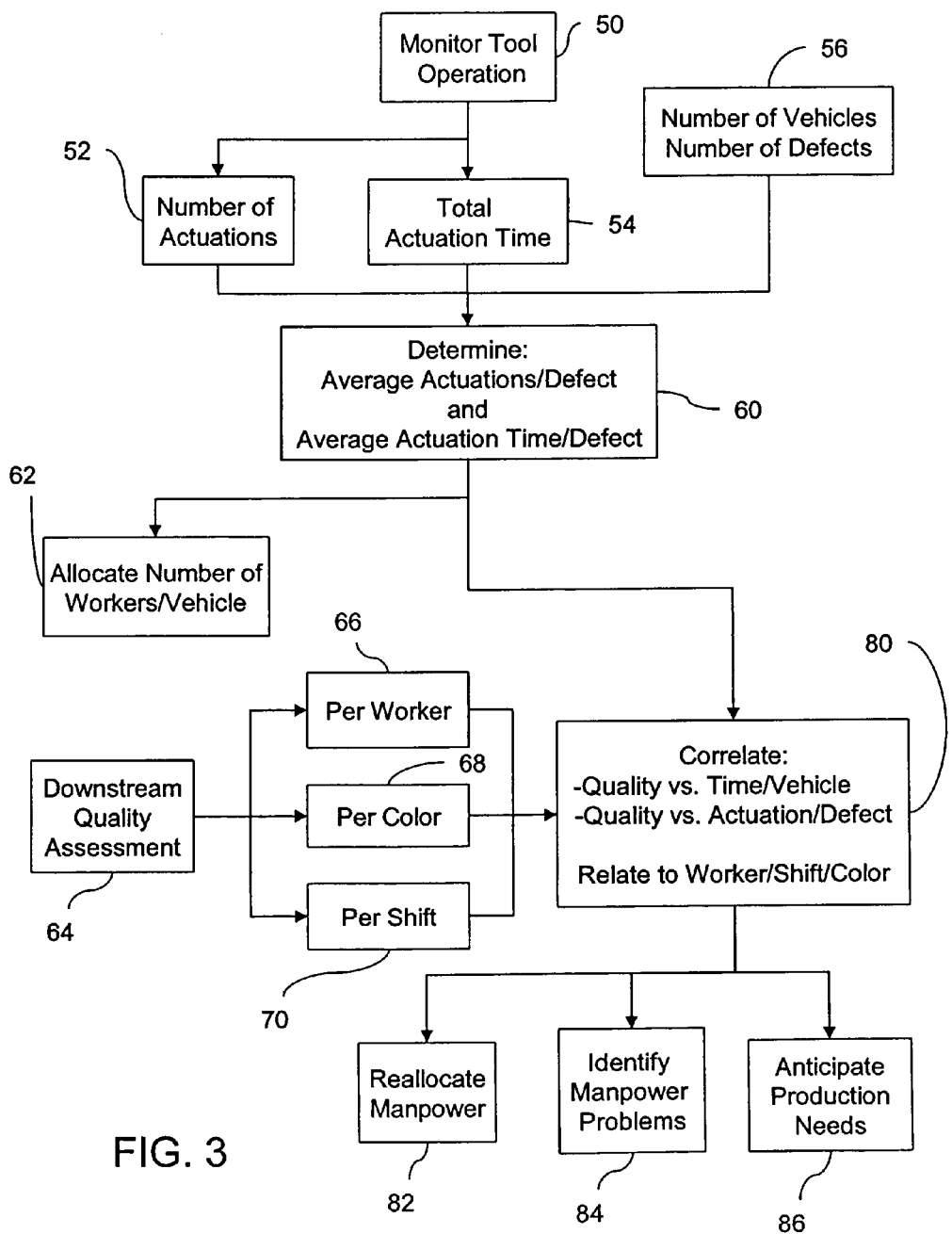
FIG. 3 is a flow chart depicting the operation of the present method.

The present invention also includes a method of monitoring and managing a manufacturing process, as shown in the operational flow chart of FIG. 3. In accordance with the steps set forth above, the method includes monitoring tool operation 50 including a step of counting power tool actuations 52 within a predetermined time period. A step of measuring actuation intervals associated with power tool actuations is performed so as to determine total actuation time 54 within the predetermined time period. The number of production units to be produced by the powered tool 14 are counted 56. The number of production units (number of vehicles/number of defects) may be input by an upstream inspector.

The measured numbers of power tool actuations, actuation intervals and production units are correlated to determine a productivity indicator 60, which represents the average actuations per production unit and/or the average actuation intervals per production unit. It should be appreciated that the tool actuations 52 and actuation times 54 can be measured for an individual worker or for a group of workers on a shift, or even for more than one shift in a production area. As such, comparisons between workers, shifts, and different days or parts of days become possible.

In response to the determination of the productivity indicator 60, a step can be performed of allocating manpower 62 in the manufacturing process based on an identified need. With the method of the present invention it is now possible to determine the actual time spent on particular processes and to properly allocate or distribute workers in response to this need. A further process can also be performed where a downstream quality assessment 64 of the production units can be obtained. The downstream quality assessment 64 can be related to the number of quality defects per worker 66, the number of quality defects per work shift 70 or the number of defects per production unit type 68. For example, where the production unit is vehicle paint, it is known that different types of paint colors are prone to different levels of defect.

The downstream quality assessment 64 is correlated with the productivity indicator 60 to determine a quality parameter 80. For example, the quality parameter 80 may be based on a comparison of quality defects for each worker 66, work shift 68, or vehicle color 70 with the average number of tool actuations per production unit and/or the average tool actuation intervals per production unit. Upon collecting this information, the manufacturing process can be modified in response to the quality parameter 80. The step of modifying the manufacturing process can include reallocating manpower 82, so as to reallocate the number of workers or worker speed to fix the problems in a more efficient manner. The quality parameter 80 can also be used to identify specific manpower problems 84, such as efficiency or quality problems with specific workers or inspectors in the manufacturing process. The quality parameter 80 can also be used to anticipate production needs 86 based on a particular production unit, i.e. a particular vehicle model or color, or a particular production shift, and to permit workers to be redistributed in anticipation of expected greater or lesser needs.

As set forth above, the present system and the attendant method enables direct measurement of the productive use of the tool. It thereby enables the improved quantification of time allotments for specific jobs. And by adding in a production count, it has become possible to improve productive output by directly associating the amount of work with the quantity and quality of the finished product. And measuring tool use, the subjective element has been removed from time trials, resulting in increased confidence in the measuring techniques. Many other benefits will no doubt become apparent from future application and development of this technology.

As described hereinabove, the present invention solves many problems associated with previous type devices. However, it will be appreciated that various changes in the details, materials and arrangements of parts, which have been herein described and illustrated in order to explain the nature of the invention, may be made by those skilled in the art without departing from the principle and scope of the invention, as expressed in the appended claims.

What is claimed is:

1. A monitoring system, comprising:
   a pressure transducer for measuring air pressure, said transducer being in communication with a compressed air supply for a pneumatic tool and being adapted to detect power consumption associated with powered and non-powered operational states of said pneumatic tool and to generate a corresponding consumption signal;
   a measuring implementation for receiving the consumption signal and measuring intervals associated with at least one of the powered and non-powered operational states, so as to produce an operational history of the pneumatic tool over a predetermined time period;
   a production counter for counting production units produced by the pneumatic tool during the predetermined time period;
   a correlating implementation for correlating the operational history with the production units, so to as generate a productivity indicator.

2. The monitoring system of claim 1, wherein the measuring implementation further comprises an implementation for processing the consumption signal so as to filter out signal components corresponding to transient tool actuations and variations in compressed air supply output.

3. The monitoring system of claim 1, wherein the production counter comprises a production input for entering a number of produced production units.

4. The monitoring system of claim 1, wherein the pressure transducer is connected to the compressed air supply with a tap, in line with compressed air supplied to the pneumatic tool, so as to communicate pressure drops arising from tool operation to the pressure transducer.

5. A method for monitoring a manufacturing process, comprising the steps of:
   detecting a consumption interval from a compressed air supply associated with a pneumatic tool corresponding to powered and non-powered operational states of the pneumatic tool, wherein the step of detecting comprises measuring pressure;
   measuring intervals associated with at least one of the powered and non-powered operational states, so as to produce an operational history of the pneumatic tool over a predetermined time period;
   counting production units produced by the pneumatic tool during the predetermined time period;
   correlating the operational history with the production units, so to as generate a productivity indicator.

6. The method of claim 5, wherein the step of detecting further comprises generating a consumption signal corresponding to powered and non-powered operational states of the pneumatic tool.

7. The method of claim 6, wherein the step of measuring further comprises processing the consumption signal so as to filter out signal components corresponding to transient tool actuations and variations in compressed air supply output.

8. The method of claim 5, further comprising a step, subsequent to the step of counting, of evaluating produced production units with respect to at least one predetermined criterion.

9. A method for monitoring and managing a manufacturing process comprising the steps of:
   counting power tool actuations within a predetermined time period;
   measuring actuation intervals associated with power tool actuations so as to determine total actuation time within the predetermined time period;
   counting production units produced by the power tool during the predetermined time period;
   correlating power tool actuations, actuation intervals and production units to determine a productivity indicator comprising at least one of average number of actuations per production unit and average actuation interval per production unit.

10. The method of claim 9, further comprising steps of:
    obtaining a downstream quality assessment of the production units;
    correlating the downstream quality assessment with the productivity indicator to determine a quality parameter;
    modifying the manufacturing process in response to the quality parameter.

11. The method of claim 10, wherein the step of obtaining a downstream quality assessment comprises measuring quality defects per at least one of worker, shift, and production unit type.

12. The method of claim 11, wherein the step of correlating to determine a quality parameter comprises comparing the quality defects with at least one of the average number of actuations per production unit and the average actuation interval per production unit.

13. The method of claim 10, wherein the step of modifying the manufacturing process comprises at least one of: reallocating manpower; identifying manpower problems; and anticipating production needs in response to the quality parameter.

14. The method of claim 9, wherein the power tool comprises a sander/buffer tool and the production units comprise vehicle paint defects corrected with the power tool.

15. The method of claim 9, further comprising a step of allocating manpower in the manufacturing process based upon the productivity indicator.

* * * * *